United States Patent [19]
Ohsawa

[11] Patent Number: 5,373,472
[45] Date of Patent: Dec. 13, 1994

[54] SEMICONDUCTOR MEMORY APPARATUS

[75] Inventor: Takashi Ohsawa, Yokohama, Japan

[73] Assignee: Kabushiki Kaisha Toshiba, Kawasaki, Japan

[21] Appl. No.: 65,363

[22] Filed: May 24, 1993

[30] Foreign Application Priority Data

May 25, 1992 [JP] Japan .................. 4-132477

[51] Int. Cl.$^5$ ............................... G11C 7/00
[52] U.S. Cl. ..................... 365/201; 365/189.07; 365/193
[58] Field of Search ............. 365/201, 191, 189.07, 365/222, 226, 233

[56] References Cited

U.S. PATENT DOCUMENTS 5,119,337  6/1992  Shimizu et al. ............... 365/201
5,245,577  9/1993  Duesman et al. .............. 365/201
5,255,229 10/1993  Tanaka et al. ................ 365/201

FOREIGN PATENT DOCUMENTS 4-225182  8/1992  Japan .

Primary Examiner—Joseph A. Popek
Attorney, Agent, or Firm—Banner, Birch, McKie & Beckett

[57] ABSTRACT

A semiconductor memory apparatus of the present invention comprises a semiconductor memory circuit and a test mode control circuit, the test mode control circuit sets a source voltage to a second voltage, which is larger than a first voltage used at the time of the normal operation, and controls the semiconductor memory circuit to be set to a predetermined voltage stress test mode by inputting a combination clock signal of clock signals unused at the time of the normal operation.

24 Claims, 8 Drawing Sheets

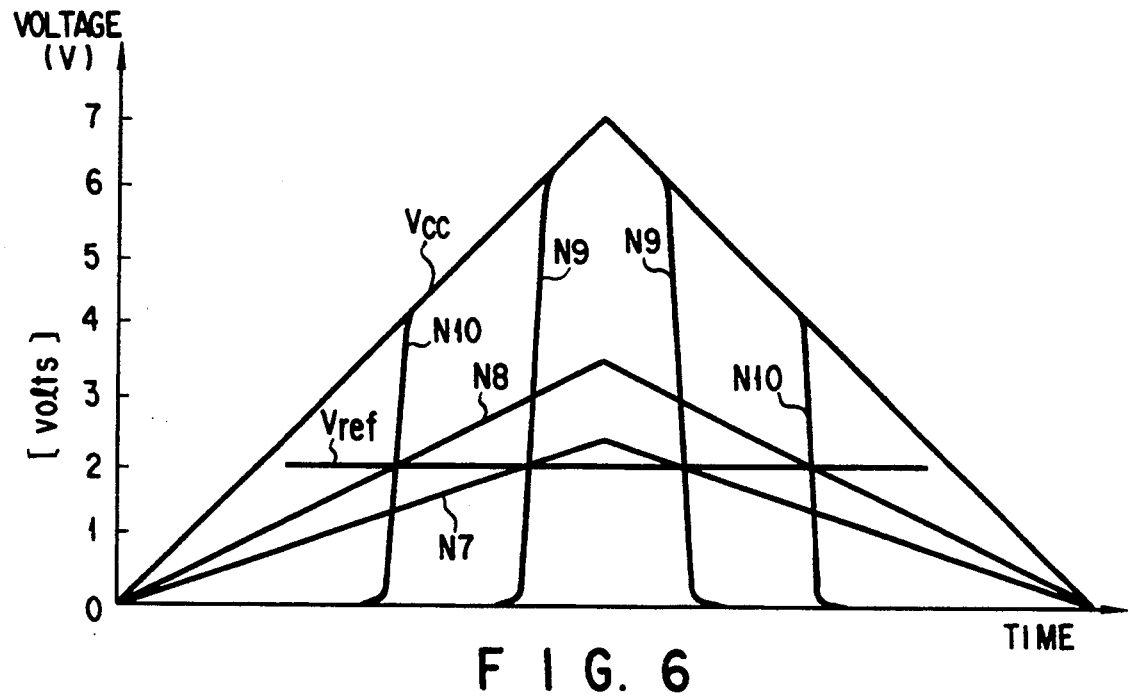
F I G. 6
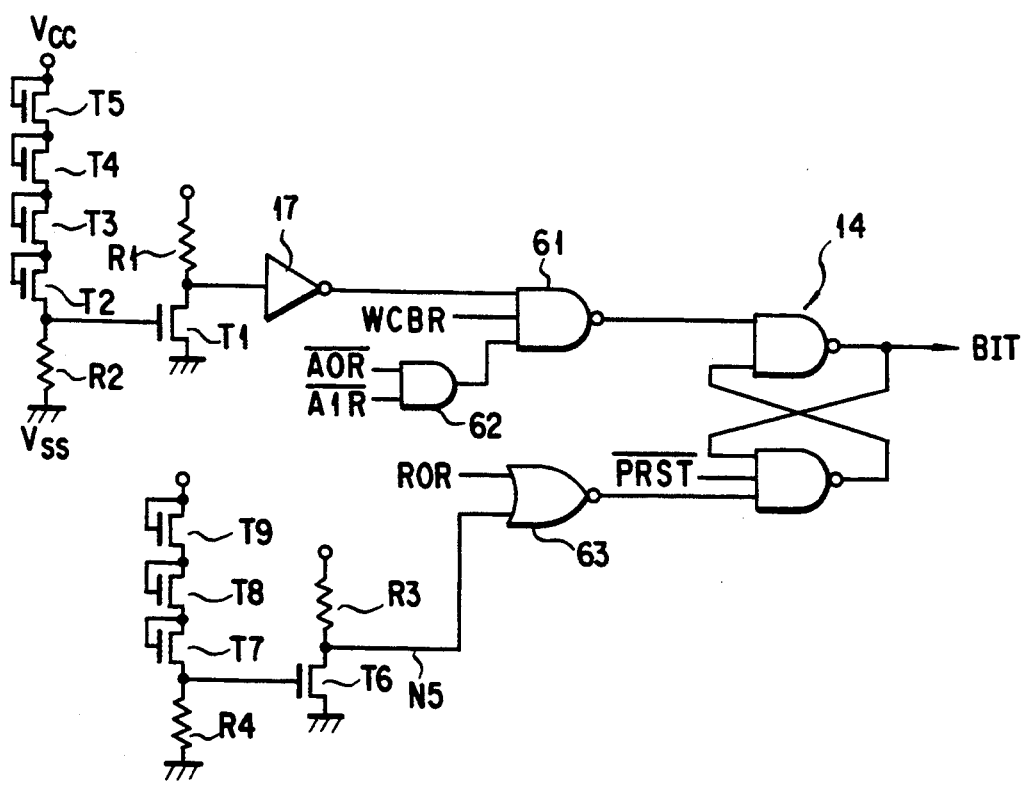
F I G. 7

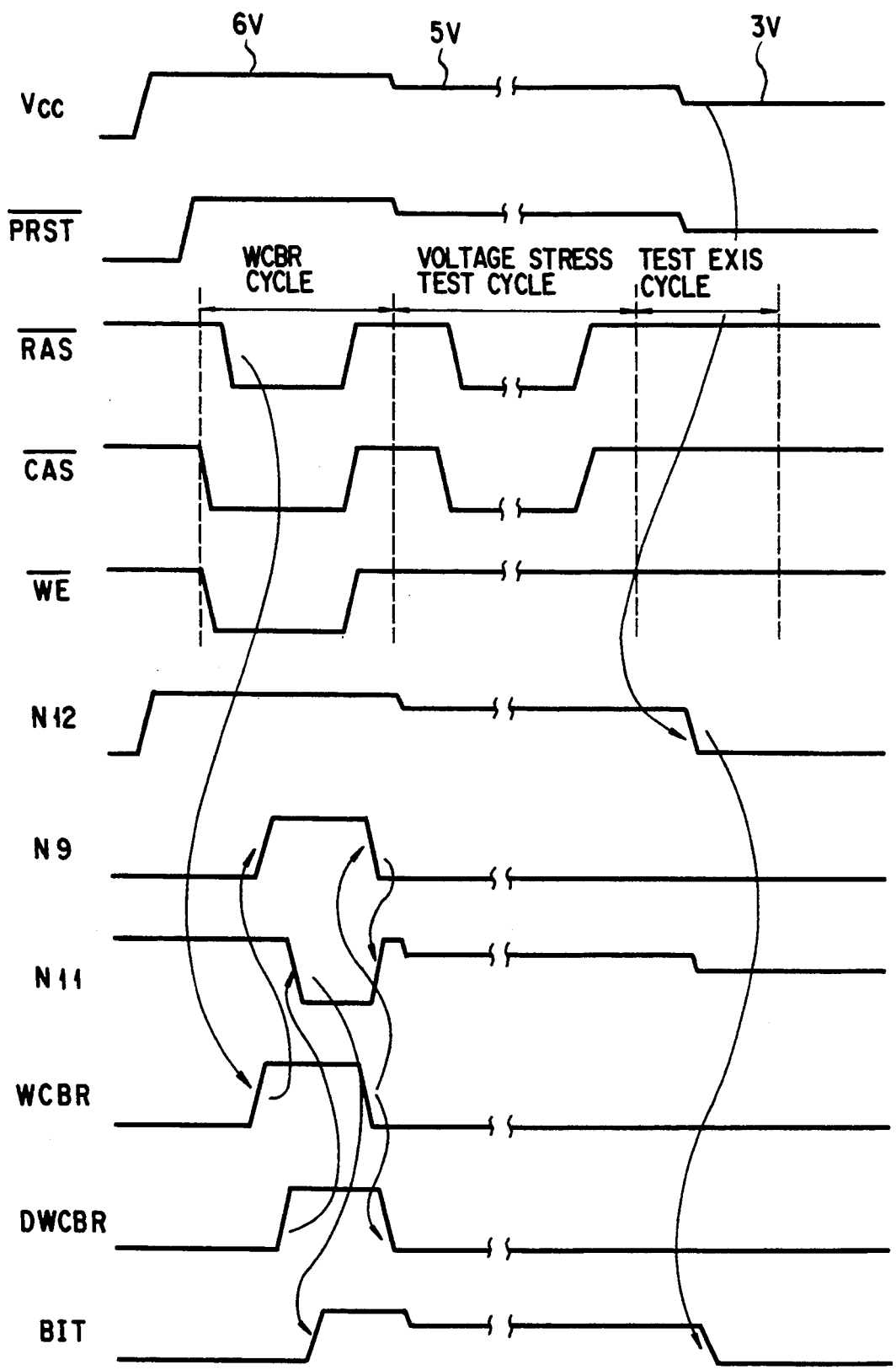
F I G. 9

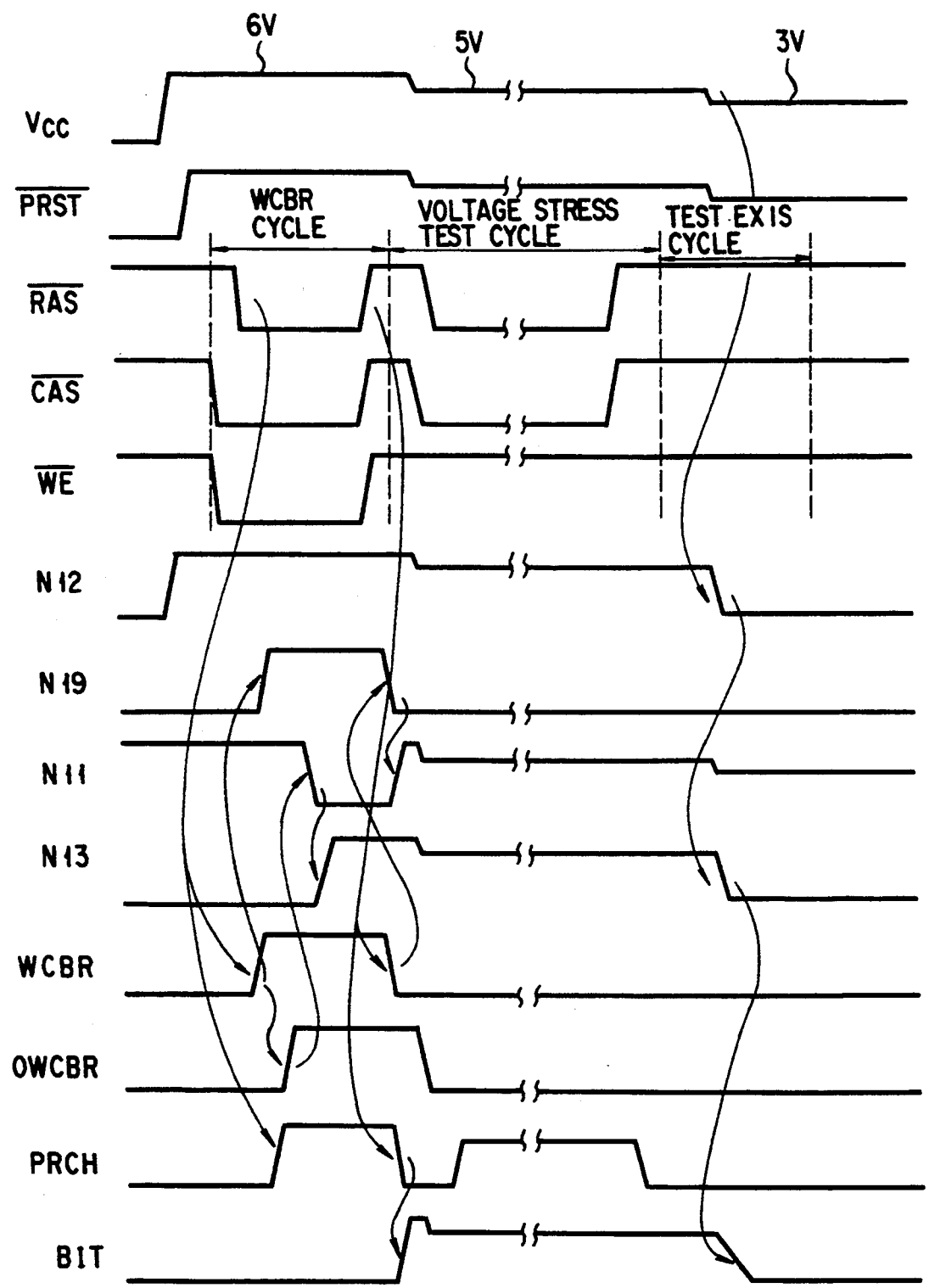
F I G. 11

SEMICONDUCTOR MEMORY APPARATUS

BACKGROUND OF THE INVENTION

1. Field of the Invention

The present invention relates to a semiconductor memory apparatus and more particularly to a control circuit setting/resetting a test mode for performing a voltage stress test of a semiconductor memory apparatus such as a DRAM (dynamic random access memory).

2. Description of the Related Art

In accordance with improvement of a fine process echnology of an integrated circuit, a number of memory bits of DRAM are increased, so that time necessary for a functional test of bits or a burn-in test is increased, and a ratio of the test cost to the manufacture cost increases.

As one of measures for reducing the test cost, there is used a multiple-bit parallel test mode in which a plurality of bits in a 1M bit DRAM generation are simultaneously tested, so that time for functional test of bits is reduced. According to the multiple-bit parallel test mode, in order that a user can test the DRAM in a state after the DRAM is sealed in a package, the DRAM is designed to be set to a test mode by providing a cycle of an input clock, which is not used at the time of the normal operation, when a source voltage of DRAM is a value to be used at the time of the normax operation.

The cycle of the input clock, which is not used at the time of the normal operation, is, for example, a WCBR cycle. Specifically, the WCBR cycle sets a WE (write enable) signal and a CAS (column address strobe) signal to be in an active level faster than a RAS (row address strobe) signal. Thereby, the multi-bits parallel test mode can be selected without exerting no influence on the normal operation.

On the other hand, in DRAM, the highest electric field (voltage stress) is applied to a gate insulating film of a transfer gate transistor (cell transistor) of a memory cell in which a word line is connected to a gate electrode. Due to this, there is strong possibility that a problem of reliability of the gate insulating film will occur. Since the refresh cycle of the DRAM doubles every time when the DRAM generation advances, a duty ratio in which the high electric field is applied to the word line is reduced by half every generation in a case that the normal cycle is repeated.

Conventionally, the burn-in of the DRAM accelerates the electric field to be applied to the gate insulating film of the cell transistor by increasing the source voltage. However, since the word line is sequentially selected, and it takes too much time to perform a screening of the gate insulating film of the cell transistor. Therefore, if the total amount of time necessary for applying the high electric field on the gate insulating film of the cell transistor and for performing the screening the gate insulating film is constant even if the DRAM generation changes, the burn-in test time increases double every generation.

In consideration of the above-mentioned problem, necessity of reducing the burn-in test time of the DRAM is increasingly required. In order to solve the abovementioned problem, it has been proposed to mount a mode in which the burn-in is performed in a state that the number of word lines to be simultaneously selected (this mode is hereinafter called as "burn-in test mode of time reduction method" to distinguish from the conventional normal burn-in mode).

One of means for realizing the burn-in test mode of time reduction method will be explained as follows:

More specifically, an exclusive pad for voltage stress test, which is not used at the time of the normal operation, is provided on a chip extra. Then, a stress voltage is applied to the pad in a wafer state of the DRAM at the time of the burn-in test, so that the word lines whose number is larger than the number of word lines to be selected at the time of the normal time are simultaneously selected, and the burn-in test is performed in this state.

However, in the burn-in test mode using the exclusive pad for voltage stress test, the user cannot perform the voltage stress test of the DRAM sealed in the package.

As other means for realizing the burn-in test mode of time reduction method, for example, Published Unexamined Japanese Patent application No. 4-225182 has proposed the following means:

More specifically, a control signal is inputted from an outer unit, so that the word lines whose number is larger than the number of word lines to be selected at the time of the normal time are simultaneously selected, and the burn-in test is performed in this state. Thereby, the DRAM can be set to the burn-in test mode of time reduction method in a wafer state of the DRAM or a state after the DRAM is sealed in a package without using the exclusive pad for voltage stress test.

In the case that the burn-in test mode of time reduction mode is used by inputting the control signal, it is desirable that the setting process for the burn-in test mode of time reduction method be provided without contradicting the setting processes for the normal access mode, normal burn-in mode and the standardized multiple-bit parallel test mode. Also, it is desirable that the process for setting the DRAM free from the burn-in test mode of time reduction method be specified.

SUMMARY OF THE INVENTION

An object of the present invention is to provide a semiconductor memory apparatus wherein a process for setting the semiconductor memory apparatus to a predetermined voltage stress mode in a wafer state of the semiconductor memory apparatus or a state after the semiconductor memory apparatus is sealed in a package without using an exclusive pad for voltage stress test can be provided without contradicting processes for setting a normal access mode, a normal burn-in mode and a standardized multiple-bit parallel test mode, and possibility that the semiconductor memory apparatus will be erroneously set to a voltage test mode by noise, etc., can be controlled to be lowered.

According to the present invention, there is provided a semiconductor memory apparatus comprising a semiconductor memory circuit; and a test mode control circuit having source voltage recognizing means for recognizing that a source voltage of said test mode control circuit is set to a second voltage being larger than a first voltage used at the time of a normal operation, and a clock signal inputting means for inputting a combination clock signal of a clock signal unused at the time of the normal operation, and for controlling said semiconductor memory circuit to be set in a predetermined voltage stress mode in response to impression of said source voltage equal to or lager than the second voltage and said combination clock signal of the clock signal.

According to the present invention, the process for setting the semiconductor memory circuit to the desired voltage stress mode (for example, voltage stress test mode of time reduction method for simultaneously supplying the voltage stress to more word lines than lines selected in a normal operation) does not contradict processes for setting the normal access mode of the semiconductor memory circuit, the normal burn-in mode and the standardized multiple-bit parallel test mode.

Therefore, there is no need of a special pad for setting the semiconductor memory circuit to a predetermined voltage stress test mode. Moreover, the semiconductor memory circuit can be set to a predetermined test mode in a wafer state of the semiconductor memory circuit or a state after the semiconductor memory circuit is sealed in a package.

Since the semiconductor memory circuit is set to a desired voltage stress mode by use of the combination of the clock signal, which is not used at the time of the normal operation, there is an extremely low possibility that the semiconductor memory circuit will be erroneously set to a voltage test mode by noise, etc.

According to the semiconductor memory apparatus of the present invention, a process for setting the semiconductor memory apparatus to a desired voltage stress mode in a wafer state of the semiconductor memory apparatus or a state after the semiconductor memory apparatus is sealed in a package without using an exclusive pad for voltage stress test can be provided without contradicting processes for setting a normal access mode, a normal burn-in mode and a standardized multiple-bit parallel test mode, and possibility that the semiconductor memory apparatus will be erroneously set to a voltage test mode by noise, etc., can be controlled to be lowered.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 6 is a characteristic view showing one example of $V_{CC}$ voltage dependency of the inner nodes of the circuit of FIG. 5;

FIG. 7 is a circuit diagram showing the other example of the burn-in test mode control circuit of FIG. 1;

FIG. 9 is a timing waveform view showing an example of the operation in a case the burn-in test mode of time reduction method is executed in DRAM having the control circuit of FIG. 8;

FIG. 11 is a timing waveform view showing an example of the operation in a case the burn-in test mode of time reduction method is executed in DRAM having the control circuit of FIG. 10.

DETAILED DESCRIPTION OF THE PREFERRED EMBODIMENTS

An embodiment of the present invention will be explained with reference to the drawings.

Figure 1:
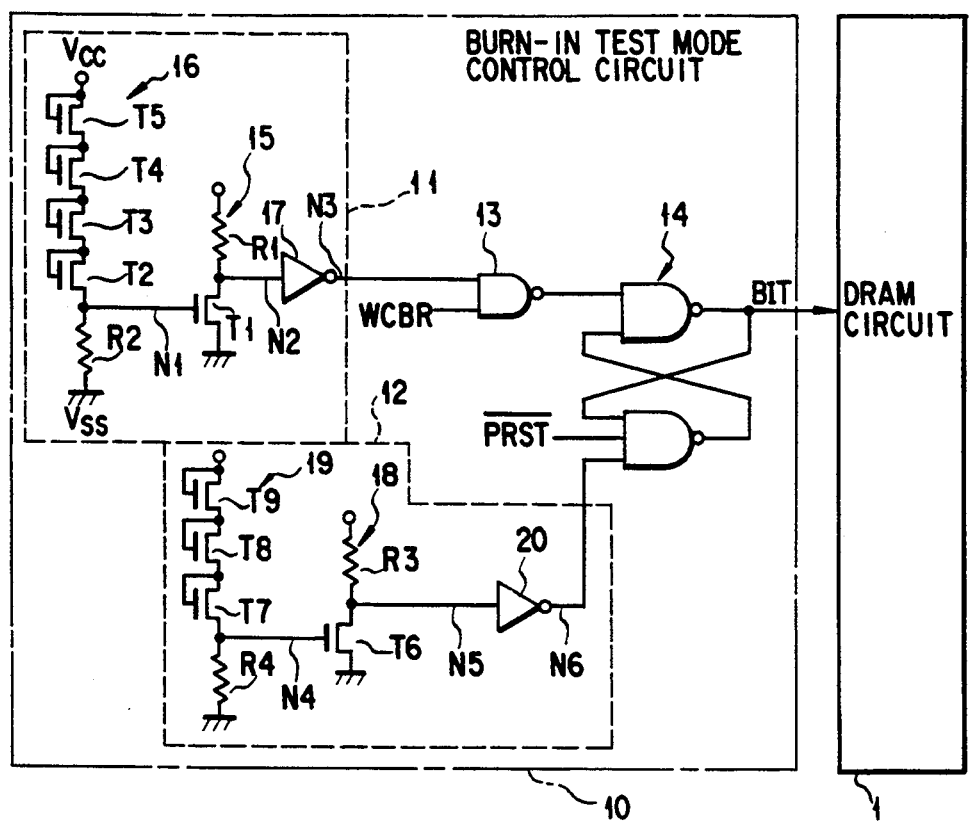
FIG. 1 is a circuit diagram showing a part of a DRAM according to one embodiment of the present invention.

FIG. 1 shows a part of DRAM according to one embodiment of the semiconductor memory apparatus of the present invention.

A DRAM circuit 1 comprises a normal access mode, a normal burn-in mode, and a standardized multiple-bit parallel test mode. The DRAM circuit 1 further comprises a burn-in test mode of time reduction method in which voltage stress is simultaneously applied to the larger number of word lines than the number of word lines selected at the time of the normal operation. At this time, the burn-in test mode of time reduction method is controlled to be set or reset by a burn-in test control signal BIT sent from a burn-in test mode control circuit 10.

The burn-in test mode control circuit 10 comprises a test mode setting circuit 11, a test mode resetting circuit 12, a 2-inputs NAND gate 13, and a flip-flop circuit 14. The test mode setting circuit 11 comprises enhancement typed N-channel MOS transistors T1 to T5 and inner nodes N1 to N3. The test mode resetting circuit 12 comprises enhancement typed N-channel MOS transistors T6 to T9 and inner nodes N4 to N6. The following explanation will be made on condition that a source voltage of the burn-in test mode control circuit 10 and a ground voltage are $V_{CC}$ and $V_{SS}$, respectively, and that $V_{CC}$ and $V_{SS}$ are applied to a source node and a ground node, respectively.

The test mode setting circuit 11 comprises an inverter 15, a voltage dividing circuit 16, and an inverter 17. The inverter 15 has a resistor R1 and the transistor T1, which are connected in series between the source node and the ground node. The voltage dividing circuit 16 has the four-stage transistors T2 to T5, which are respectively diode-connected, and a resistor R2. The transistors T2 to T5 and the resistor R2 are connected in series between the source node and the ground node. The voltage dividing circuit 16 supplies a voltage of a connecting point (node N1) between the transistor T2 and the resistor R2 to the gate of the transistor T1. The inverter 17 is formed by connecting an input terminal to the output node N2 of the inverter 15.

In the NAND gate 13, one input terminal is connected to the output node N3 of the test mode setting circuit 11, and a WCBR signal is inputted to the other input terminal. The WCBR signal is in a low level ("L"

level) at the time of the normal operation, and in a high level ("H" level) when a WCBR cycle is designated.

The test mode resetting circuit 12 comprises an inverter 18, a voltage dividing circuit 19, and an inverter 20. The inverter 18 has a resistor R3 and the transistor T6, which are connected in series between the source node and the ground node. The voltage dividing circuit 19 has the three-stage transistors T6 to T8, which are respectively diode-connected, and a resistor R4. The transistors T6 to T8 and the resistor R4 are connected in series between the source node and the ground node. The voltage dividing circuit 19 supplies a voltage of a connecting point (node N4) between the transistor T7 and the resistor R4 to the gate of the transistor T6. The inverter 20 is formed by connecting an input terminal to the output node N5 of the inverter 18.

The flip-flop circuit 14 comprises two 2-inputs NAND gates, which are cross-connected thereto. An output of the NAND gate 13 is inputted to a set input terminal and an output of the test mode resetting circuit 12 is inputted to a reset input terminal, and a preset signal/PRST is inputted to a preset input terminal.

An output of a set output terminal of the flip-flop circuit 14 is used as the burn-in test control signal BIT.

The preset signal/PRST is kept to be in an "L" level for a fixed period of time since the power supply. The fixed period of time. For the fixed period of time, the flip-flop circuit 14 is settled in a reset state, thereafter, set to an "H" level.

Figure 2:
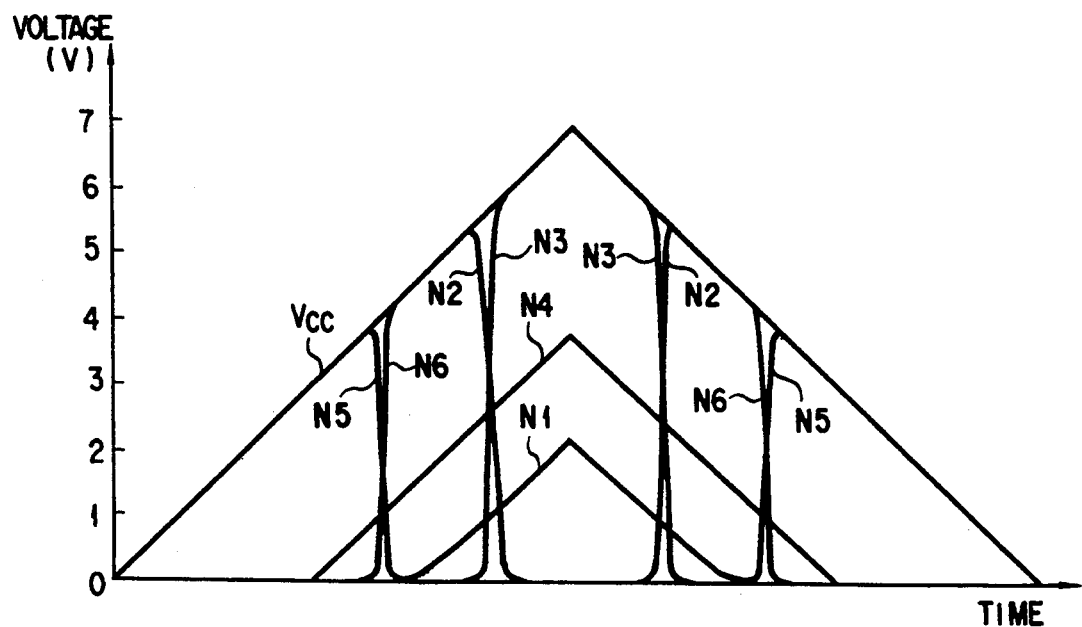
FIG. 2 is a characteristic view showing one example of $V_{CC}$ voltage dependency of an inner node in a burn-in test mode control circuit of FIG. 1.

FIG. 2 shows $V_{CC}$ dependency of the inner nodes N1 to N6 of the burn-in test mode control circuit 10 of FIG. 1.

When the source voltage $V_{CC}$ increases, the node N2 drops to the "L" level and the node N3 rises to the "H" level if the voltage of the node N1 becomes larger than a threshold voltage Vth of the transistor T1. If the voltage of the node N4 becomes larger than a threshold voltage Vth of the transistor T6, the node N5 drops to the "L" level, and the node N6 rises to the "H" level.

Actually, in the transistors T2 to T6, the respective sources of the transistors T2 to T5 float from the earth level, a different substrate bias effect works and the respective threshold voltages Vth rise in order, and the node N3 becomes "H" level wherein $V_{CC} > 5 \times Vth$ (for example, 6 V). In the transistors T7 to T9, the respective sources of the transistors T7 to T9 float from the earth level, a different substrate bias effect works and the respective threshold voltages Vth rise in order, and the node N5 becomes "L" level wherein $V_{CC} > 4 \times Vth$ (for example, 4V).

When the source voltage $V_{CC}$ drops, the node N2 is in an "H" level, and the node N3 is in an "L" level if the voltage of the node N1 becomes smaller than the threshold voltage Vth of the transistor T1.

If the WCBR cycle is executed when the source voltage $V_{CC}$ is 6V or more, 2-inputs of the NAND gate 13 are in "H" level and the outputs are in "L" level. When the output of the NAND gate 13 is in "L" level, the flip-flop circuit 14 is in a set state and the BIT signal is in "H" level, and the DRAM circuit 1 is set to the burn-in test mode of time reduction method. At this time, since the voltage of the node N4 is larger than the threshold voltage Vth of the transistor T6 and the node N5 is in "L" level, and the Node N6 is in "H" level, the reset input of the flip-flop circuit 14 is in an invalid state.

When the source voltage $V_{CC}$ is 4V or less, the voltage of the node N4 is smaller than the threshold voltage Vth of the transistor T5 and the node N5 is in "H" level, and the node N6 is in "L" level. When the node N6 is in "L" level, the flip-flop circuit 14 is in a reset state and the BIT signal is in "L" level, and the DRAM circuit 1 is set free from the burn-in test mode. At this time, since the voltage of the node N1 is smaller than the threshold voltage Vth of the transistor T1, the node N2 is in "H" level, the node N3 is "L" level, and the output of the NAND gate 13 is in "H" level, the set input of the flip-flop circuit 14 is in an invalid state.

Figure 10:
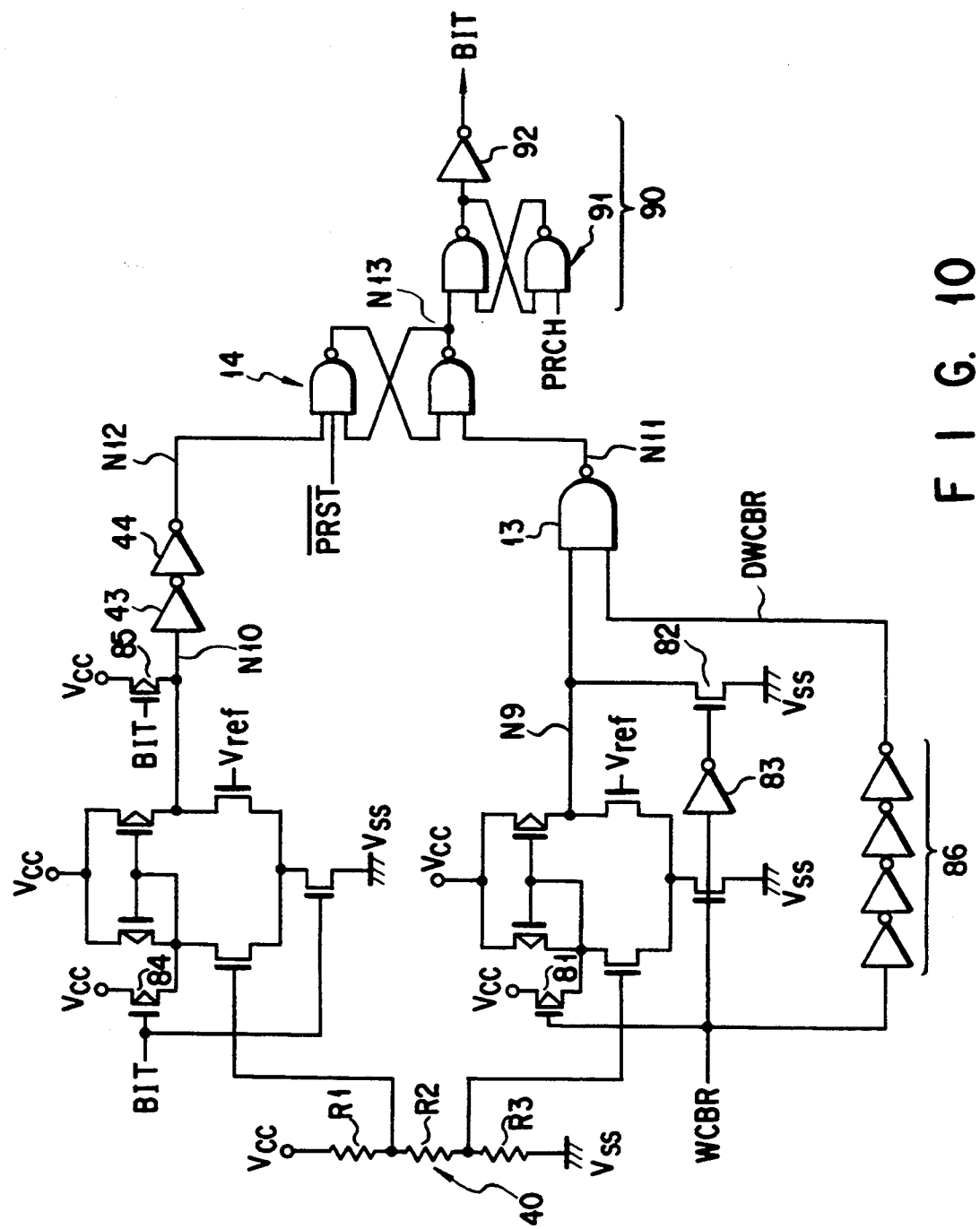
FIG. 10 is a circuit diagram showing improvement of the control circuit of FIG. 8.

In the burn-in test mode control circuit 10 of FIG. 10, the four-stage diode-connected transistors T2 to T5, which are included in the test mode setting circuit 11, determine a test mode setting voltage $V_{CCIN}$, which is the value of the source voltage in setting the test mode. Then, the three-stage diode-connected transistors T7 to T9, which are included in the test mode resetting circuit 12, determine a test mode reset voltage $V_{CCOUT}$, which is the value of the source voltage in resetting the test mode. The test mode reset voltage $V_{CCOUT}$ is much smaller than the test mode setting voltage $V_{CCIN}$, that is, the value of the source voltage to be used at the time of the burn-in test mode, for example, a value smaller than 5V.

Figure 3:
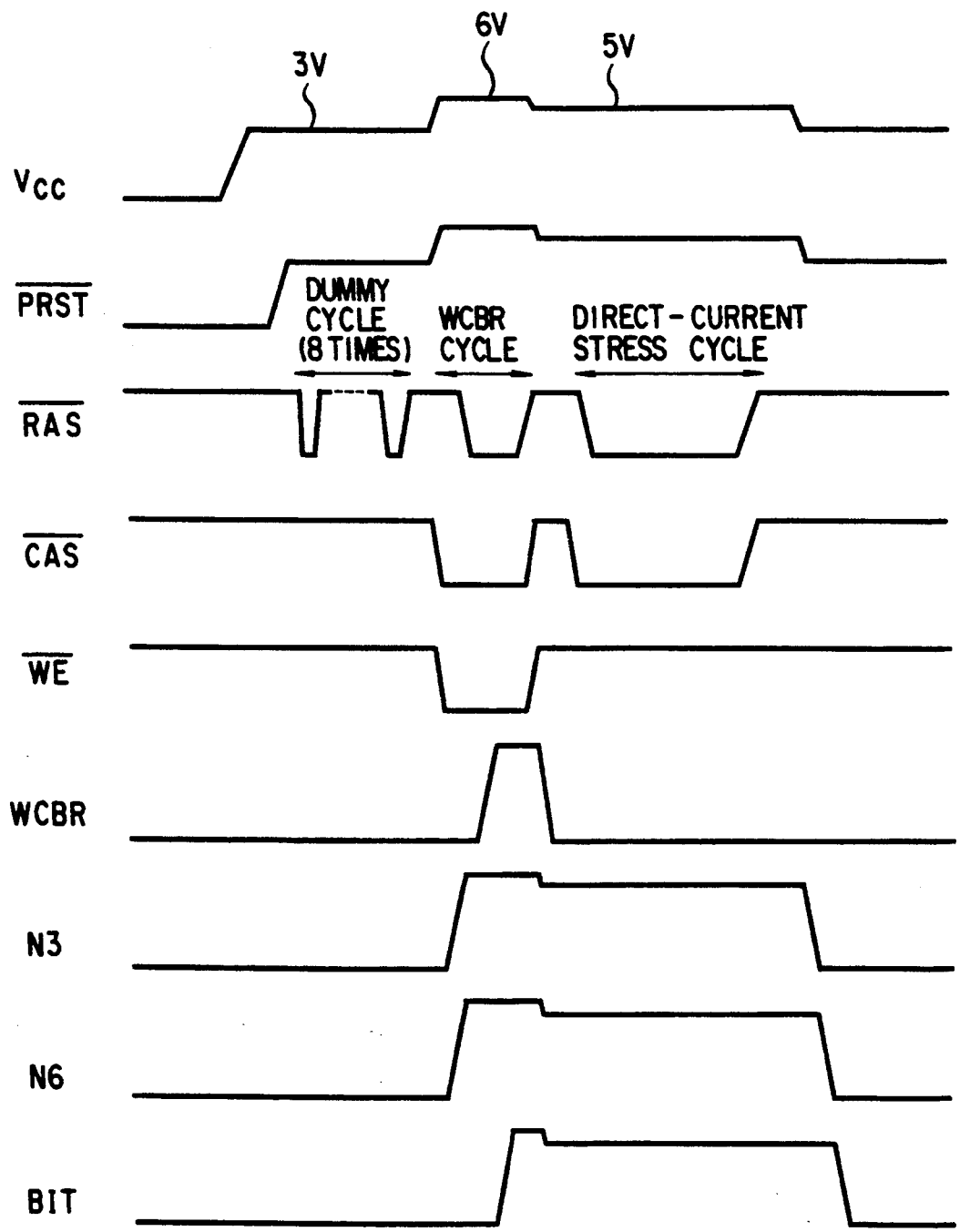
FIG. 3 is a voltage waveform view showing an example of an operation of DRAM of FIG. 1.

FIG. 3 shows a cycle for executing the burn-in test mode of the time reduction method by use of DRAM of FIG. 1.

First, the source voltage $V_{CC}$ rises up to the value of the normal use condition (e.g., 3V), and a dummy cycle (RAS only refresh cycle), which is necessary for initializing the DRAM circuit 1, is repeated eight times. Thereafter, the source voltage $V_{CC}$ rises up to 6V, and a clock of the WCBR cycle is inputted thereto. As a result, the BIT signal rises by the burn-in test mode control circuit 10, and enters the burn-in test mode of the time reduction method. In this case, the source voltage $V_{CC}$ is reduced to the burn-in voltage (in this case, 5V) and voltage stress is applied thereto, if necessary. According to this embodiment, in the burn-in test mode of the time reduction method, there is shown a case of a direct current stress test mode. More specifically, for example, a clock of the CBR cycle, which sets the/CAS signal to be in an active level faster than the/RAS signal, is inputted, thereby setting the direct current stress test mode, which applies stress of the source voltage $V_{CC}$ to the larger number of word lines (for example, all word lines), is larger than the number of the word lines selected at the time of the normal operation, in a direct current manner.

After the end of the burn-in test mode, the source voltage $V_{CC}$ drops to the value of the normal use condition (3V), so that the BIT signal drops to the "L" level, and the DRAM circuit 1 is set free from the burn-in test mode.

The DRAM of the above embodiment is set to the burn-in test mode of time reduction method at the WCBR cycle when $V_{CC} > 6V$, and set free from the burn-in test mode when $V_{CC} < 4V$. As a result, the following advantages (1) to (3) can be obtained:

(1) It is possible to set the DRAM to the burn-in test mode of time reduction method at the different process from the normal access mode, and such a setting does not contradict the setting process of the conventional standardized multiple-bit parallel test mode. Moreover, there is upper compatibility at the set cycle of the multiple-bit parallel test mode (WCBR cycle at the value of the source voltage $V_{CC}$ under the normal use condition). There is also upper compatibility in the normal burn-in mode in which the burn-in is performed by the conventional method, that is, the source voltage $V_{CC}$ is set to be high and the word line is sequentially selected. As a normal burn-in mode, there can be considered a case of a mode in which the source voltage is simply high, a case in which a supply voltage converter is used, and a case of a mode in which the level of the word line is accelerated to be different from the level at the time of the normal operation when the level of the word line is limited.

According to the above embodiment, since there is no need of a special pad to realize the setting the DRAM to the burn-in test mode of time reduction method, it is possible to set the DRAM to the burn-in test mode of time reduction method in a state that DRAM is in a wafer state or after DRAM is sealed in the package. For performing the burn-in test of time reduction method in the wafer state, a test device such as a probe card to be used in a normal functional test can be used. For performing the burn-in test of time reduction method after DRAM is sealed in the package, a normal memory tester can be used.

(2) Since DRAM is set to the burn-in test mode of time reduction test by the combination with timing, which is not used at the normal operation (WCBR cycle in this case), there is extremely low possibility that DRAM is erroneously set to the test mode due to noise, etc.

(3) Hysteresis is provided to the value of the source voltage $V_{CC}$ of the test mode setting/resetting. Therefore, even in a case that there is little voltage difference between the value of the source voltage $V_{CC}$ at the time of the normal use and the value of the source voltage $V_{CC}$ at the time of the burn-in, the value of the source voltage $V_{CC}$ can be set to be a large value for setting the burn-in test mode of time reduction method not to be erroneously set due to noise etc.

According to the above embodiment, the source voltage $V_{CC}$ rose up to 3V after the power-on of the source voltage, and the dummy cycle was repeated. However, the present invention is not limited to the above case. For example, the source voltage of 6V is directly turned on, and DRAM may be set at the WCBR cycle. Moreover, the test mode setting voltage $V_{CCIN}$ is set to be lower than the burn-in voltage, for example, about 4.5V, and the burn-in voltage of 5V is directly turned on, and DRAM can be set at the WCBR cycle.

Moreover, in the above embodiment, it was explained that the source voltage $V_{CC}$ of the voltage dividing circuits 16 and 19 and that of the inverters 15 and 18, which are included in the test mode setting circuit 11 and the test mode resetting circuit 12, were the same. However, the source voltage of the inverters 15 and 18 may be set to be enough to drive the inverters 15 ad 18.

Figure 4:
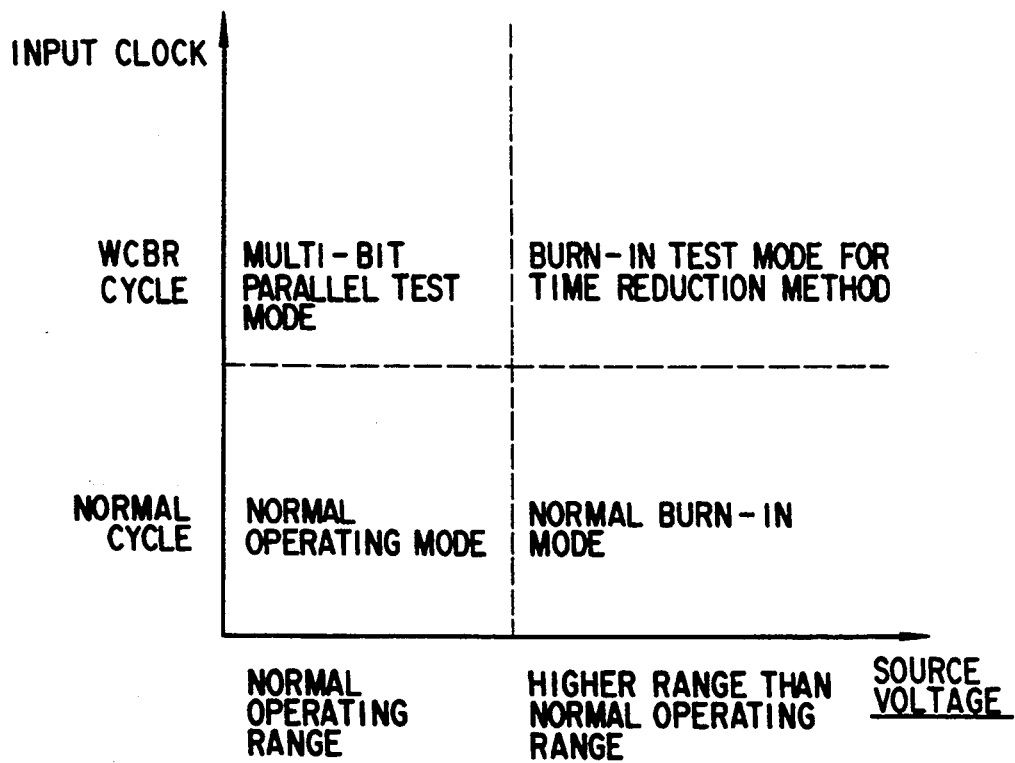
FIG. 4 shows a difference between the normal mode in the DRAM to which the present invention is applied and each of three special modes in the setting method.

FIG. 4 shows a difference between the normal mode in the DRAM to which the present invention is applied and each of the normal burn-in mode, the multiple-bit parallel test mode, and the burn-in test mode of time reduction method in the setting method. As is obvious from FIG. 4, it can be understood that the normal operation mode and the three special modes (normal burn-in mode, multiple-bit parallel test mode, and burn-in test mode of time reduction method) are incorporated without interfering with each other.

Since the burn-in test mode control circuit 10 shown in FIG. 1 determines the source voltage for the test mode setting/resetting by the threshold voltage Vth of the transistor, there may occur a disadvantage when the value of Vth varies due to the variation of the processes.

Figure 5:
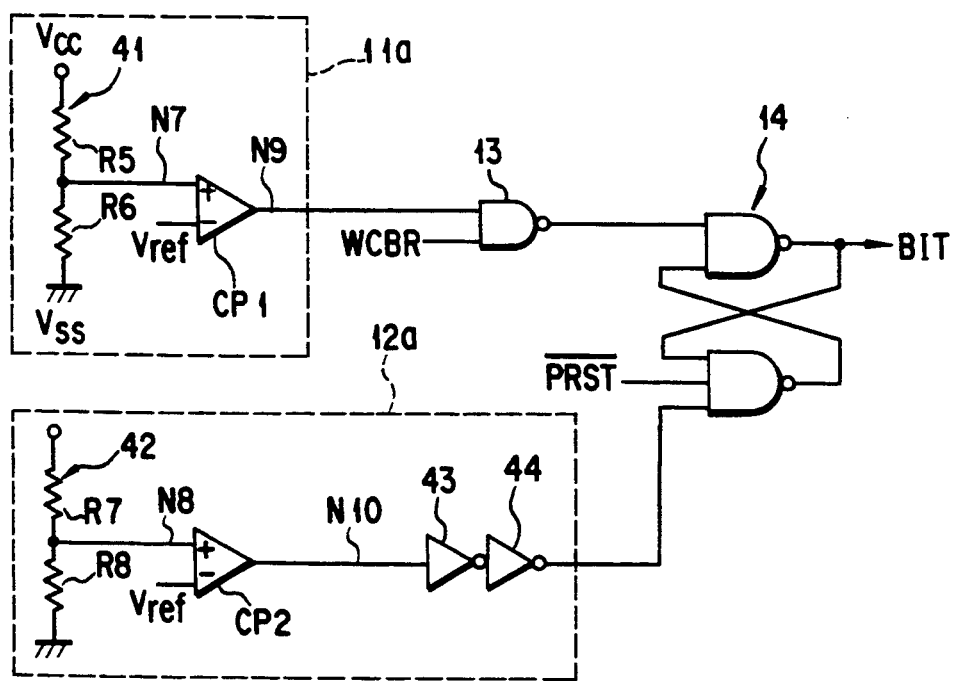
FIG. 5 is a circuit diagram showing the other example of the burn-in test mode control circuit of FIG. 1.

A circuit improved to prevent this problem is shown in FIG. 5.

FIG. 5 is another example of the control circuit of FIG. 1.

The control circuit of FIG. 5 differs from the burn-in test mode control circuit 10 of FIG. 1 in the provision of a test mode setting circuit 11a and a test mode resetting circuit 12a, and the other structure is the same as the control circuit of FIG. 1, and the same reference numerals are added thereto.

The test mode setting circuit 11a compares a voltage of a voltage dividing node (node N7) of a first resistor dividing circuit 41 with a reference voltage Vref by a voltage comparator circuit CP1, and outputs a test mode setting signal from an output terminal (node N9) of the voltage comparator circuit CP1.

The test mode resetting circuit 12a compares a voltage of a voltage dividing node (node NS) of a second resistor dividing circuit 42 with the reference voltage Vref by a voltage comparator circuit CP2, and outputs a test mode resetting signal from an output terminal (node N10) of the voltage comparator circuit CP2 through two-stage inverters 43 and 44.

The resistor ratio of a resistor R5 to a resistor R6 in the first resistor dividing circuit 41 is different from the resistor ratio of a resistor R7 to a resistor R8 in the second resistor dividing circuit 42. $V_{CC}$ voltage dependency of the node N8 is designed to be larger than that of the node N7. The reference voltage Vref is a current voltage, which is supplied from the output of, for example, a band cap reference circuit (not shown).

FIG. 6 shows $V_{CC}$ dependency of inner nodes N7 to N10 in the control circuit of FIG. 5.

In this embodiment, Vref=2V and the node N7 crosses Vref when $V_{CC}$=6V, and the node N8 crosses Vref when VCC=4V.

The node N9 is in "H" level when $V_{CC}>$6V, and the node N10 is in "H" level when $V_{CC}>$4V. Therefore, the control circuit of FIG. 5 can obtain basically the same technical advantage as the burn-in test mode control circuit 10 of FIG. 1 by the same function of the circuit 10 of FIG. 1.

FIG. 7 shows another example of the burn-in test mode control circuit of FIG. 1.

The control circuit of FIG. 7 differs from the burn-in test mode control circuit 10 of FIG. 1 in the points that 2-inputs NAND gate 13 is changed to a 3-inputs NAND gate 61 and a 2-inputs AND gate 62 is added, and the inverter 20 is changed to a 2-inputs NOR gate 63. The other structure is the same as the control circuit of FIG. 1, and the same reference numerals are added thereto.

An/A0R signal, which is a part of the row address signal, and an/A1R signal are inputted to the 2-inputs AND gate 62. The output of the 2-inputs AND gate 62 is inputted to one input terminal of the 3-inputs NAND gate 61. The same signal as inputted to the 2-inputs NAND gate 13 of the burn-in test mode control circuit of FIG. 1 is inputted to the other two input terminals of the 3-inputs NAND gate 61. A signal (ROR signal in this case), which is generated when the signal of the node N5 and the clock of the refresh cycle (for example, RAS only refresh cycle) are inputted, is inputted to the 2-inputs NOR gate 63.

The control circuit of FIG. 7 has the following function.

More specifically, when the source voltage $V_{CC}$ is set to be higher than the value, which is out of the range of the normal operation, and a part of the address signal is set to have a specific combination (in this case, both- /A0R signal and /A1R signal are in "L" level), the DRAM is set to the burn-in test mode. Moreover, when the source voltage $V_{CC}$ is set to be lower than a certain value or the clock of the ROR cycle is inputted, the DRAM is set free from the burn-in test mode. Thereby, the same technical advantage as the burn-in test mode control circuit 10 of FIG. 1 can be obtained.

Figure 8:
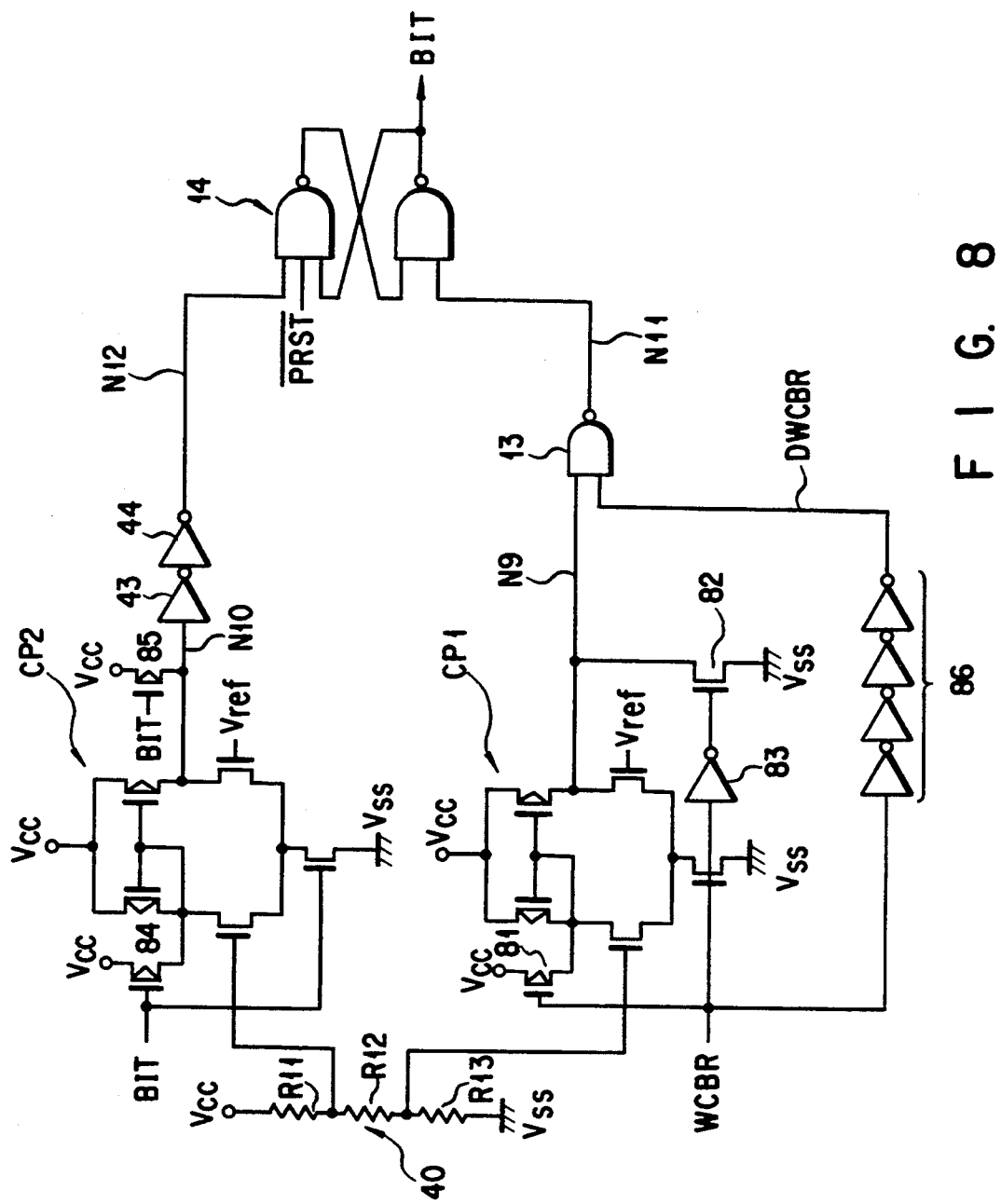
FIG. 8 is a circuit diagram showing improvement of the control circuit of FIG. 5.

FIG. 8 shows improvement of the control circuit of FIG. 5.

The circuit of FIG. 8 is improved not to the standby feedthrough current of the voltage comparator circuits CP1 and CP2 at the time of the normal operation mode. The control circuit of FIG. 8 differs from that of FIG. 5 in the following points and the other structure is the same as the control circuit of FIG. 5, and the same reference numerals are added thereto.

(a) Differential amplifier circuits of current mirror load type are used as voltage comparator circuits CP1 and CP2, respectively;

(b) It is controlled by the WCBR signal whether or not the operation of the voltage comparator circuit CP1 is performed;

(c) A PMOS transistor 81 is connected between one of the output nodes of the voltage comparator circuit CP1 and the source node, and the WCBR signal is supplied to the gate of the PMOS transistor 81;

(d) An NMOS transistor 82 is connected between the output node N9 of the voltage comparator circuit CP1 and the ground node, and the WCBR signal, which is inverted by an inverter 83, is supplied to the gate of the NMOS transistor 83;

(e) It is controlled by the BIT signal whether or not the operation of the voltage comparator circuit CP2 is performed;

(f) PMOS transistors 84 and 85 are connected between a pair of output nodes of the voltage comparator circuit CP2 and the source node, and the BIT signal is supplied to the gate of each of the PMOS transistors 84 and 85;

(g) The first and second voltage dividing circuits 41 and 42 are omitted, and a resistor dividing circuit 40, which is formed by connecting resistors R11, R12 and R13 are connected between the source node and the ground node in series, is used. The partial voltage of the connecting point between the resistors R11 and R12 is supplied as a reference voltage of the voltage comparator circuit CP2, and the partial voltage of the connecting point between the resistors R12 and R13 is supplied as a reference voltage of the voltage comparator circuit CP1; and (h) Regarding the WCBR signal, a delay signal DWCBR, which is passed through a delay circuit 86 comprising, for example, a four-stage inverter circuit, is used as one of the NAND gate 13.

FIG. 9 is a timing waveform view showing an example of the operation in a case the burn-in test mode of time reduction method is executed in DRAM having the control circuit of FIG. 8.

In the control circuit of FIG. 8, the WCBR signal is in "L" level at the time of the normal operation mode, and the voltage comparator circuit CP1 is controlled to be in an off state. Due to this, no standby feedthrough current is generated. At this time, since the BIT signal is in "L" level, and the voltage comparator circuit CP2 is controlled to be in an off state, no standby feedthrough current is generated.

On the other hand, at the time when the DRAM is set to the burn-in test mode of time reduction method, if the source voltage $V_{CC}$ is set to be higher than the test mode setting voltage $V_{CCIN}$ and the WCBR cycle is executed, the WCBR signal is in "H" level, and the voltage comparator circuit CP1 is activated, and the output node N9 is in "H" level. Then, if delay time of the delay circuit 86 passes, 2-inputs of the NAND gate 13 are in "H" level, and the output node N11 is in "L" level, so that the flip-flop circuit 14 is in a set state, and the BIT signal is in "H" level.

As mentioned above, if the BIT signal is once in "H" level, the voltage comparator circuit CP2 is activated. Thereafter, at the time when the DRAM is set free from the burn-in test mode of time reduction method, if the source voltage $V_{CC}$ is set to be lower than the test mode reset voltage $V_{CCOUT}$, the output node N10 of the voltage comparator circuit CP2 is in "L" level. Due to this, the output node N12 of an inverter circuit 44 is in "L" level, and the BIT signal is in "L" level.

As mentioned above, after the WCBR signal of "H" level is inputted, the control circuit of FIG. 8 may discriminate whether or the source voltage $V_{CC}$ is higher or lower in order to determine whether or not the DRAM is set to the burn-in mode test mode of time reduction method. Therefore, there is no need that the voltage comparator circuit CP1 is always activated.

The voltage comparator circuit CP2 is used so as to set the DRAM free from the burn-in test mode of time reduction method. Since the voltage comparator circuit CP2 may be activated after the DRAM is set to the burn-in test mode of time reduction method, there is no need that the voltage comparator circuit CP2 is activated at the time of the normal operation mode.

In other words, since the voltage comparators CP1 and CP2 can be set in a non-active state at the time of the normal operation, no consumption current can be generated at the time of standby, so that a DRAM with low consumption electric power can be realized.

In the control circuits of the above mentioned embodiments, if the BIT signal is changed to "H" level immediately after discriminating that the combination of the clock signal, which is not used at the time of the normal operation, is inputted (for example, WCBR cycle), the word line selection ability of row address disappears in the middle of the cycle in which the DRAM is set to the burn-in test mode of time reduction method, and the large number of word lines tends to rise simultaneously. In this case, if the driving ability of pressure rising voltage for the word line driving, which is generated in the chip, is low, the pressure rising voltage is reduced to an extremely low level, and the WCBR cycle may not be completed.

FIG. 10 shows one example of a control circuit, which can deal with the above-mentioned case.

The control circuit of FIG. 10 controls the DRAM circuit 1 to be set to the burn-in test mode of time reduction method after discriminating that the combination of the clock signal, which is not used at the time of the normal operation, is inputted (for example, WCBR cycle) after the precharge cycle of the DRAM circuit 1 is started. The control circuit of FIG. 10 differs from that of FIG. 8 in the following point, and the other structure is the same as the control circuit of FIG. 8, and the same reference numerals are added thereto.

(a) A latch circuit 90 is additionally connected. The latch circuit 90 comprises, for example, a second flip-flop circuit 91 and an inverter 92 for inverting the output of the flip-flop circuit 91, and is used to latch the output of the flip-flop circuit 14 by a precharge signal PRCH, and to output a BIT signal.

FIG. 11 is a timing waveform view showing an example of the operation in a case the burn-in test mode of time reduction method is executed in DRAM having the control circuit of FIG. 10.

In the DRAM having the control circuit of FIG. 10, if the source voltage $V_{CC}$ is set to be higher than the test mode setting voltage $V_{CCIN}$ and the WCBR cycle is executed in setting the DRAM to the burn-in test mode of time reduction method, the flip-flop circuit 14 is in a setting state, and the set output node N13 is in "H" level by the same operation as in the control circuit of FIG. 8.

After the WCBR cycle is discriminated, the PRCH signal is in "H" level, and the precharge cycle is started. Then, when the PRCH signal is in "L" level, the latch circuit 90 latches the set output of the flip-flop circuit 14, and sets the BIT signal to be in level. Under this latching state, even if "H" and "L" levels of the PRCH are repeated, the BIT signal is in "H" level as it is.

According to the DRAM of each of the embodiments, if the output signal BIT of the burn-in test mode control circuit 10 is fetched to the outer unit of the chip through, for example, the inverter circuit or an extra pad (not shown), it is possible to monitor and confirm the state of the control of setting/resetting the burn-in test mode of time reduction method by the outer unit.

The above embodiments explained the case of the voltage stress test in performing the burn-in. However, it is needless to say that the present invention can be useful for performing the voltage stress test regardless of thermal acceleration.

The present invention is not limited to the DRAM of the above-explained embodiments. The present invention can be applied to the other semiconductor memory.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:
   a memory circuit operable in a normal operation mode in response to a first logic level of an operation mode signal and in a test mode in response to a second logic level of the operation mode signal, said memory circuit receiving a source voltage at a first predetermined voltage during said normal operation mode;
   a test mode control circuit for receiving said source voltage and a first clock signal, for supplying said operation mode signal at said second logic level to said memory circuit when said source voltage is equal to or higher than a second predetermined voltage and said first clock signal has a prescribed first clock signal state, and for supplying said operation mode signal at said first logic level to said memory circuit when said source voltage is equal to or lower than a third predetermined voltage independent of said first clock signal, wherein said second predetermined voltage is different from said first predetermined voltage and said third predetermined voltage is different from said first and second predetermined voltages.

2. The device according to claim 1, wherein said test mode control circuit comprises:
   a source voltage comparing circuit for comparing said source voltage with said second predetermined voltage to detect that said source voltage is equal to or higher than said second predetermined voltage;
   a circuit, responsive to said source voltage comparing circuit, for outputting said operation mode signal at said second logic level when said source voltage is equal to or higher than said second predetermined voltage and said first clock signal has said prescribed first clock signal state.

3. The device according to claim 2, wherein said source voltage comparing circuit comprises a differential amplifier circuit for comparing said source voltage with said second predetermined voltage to detect that said source voltage is equal to or higher than said second predetermined voltage.

4. The device according to claim 3, wherein said differential amplifier circuit has a current source that activates said differential amplifier circuit when said first clock signal has said prescribed first clock signal state.

5. The device according to claim 1, wherein said test mode control circuit comprises:
   a source voltage comparing circuit for comparing said source voltage with said third predetermined voltage to detect that said source voltage is equal to or lower than said third predetermined voltage;
   a circuit, responsive to said source voltage comparing circuit, for outputting said operation mode signal at said first logic level when said source voltage is equal to or lower than said third predetermined voltage.

6. The device according to claim 5, wherein said source voltage comparing circuit comprises a differential amplifier circuit for comparing said source voltage with said third predetermined voltage to detect that said source voltage is equal to or lower than said third predetermined voltage.

7. The device according to claim 6, wherein said differential amplifier circuit has a current source that activates the differential amplifier circuit when said operation mode signal has said first logic level.

8. The device according to claim 1, wherein said memory circuit operates in a voltage stress mode when said operation mode signal has said second logic level.

9. The device according to claim 1, wherein said memory circuit comprises a dynamic random access memory circuit, and said test mode control circuit includes means for inputting a write enable (WE) signal, a column address strobe (CAS) signal, and a row address strobe (RAS) signal, and means for controlling said dynamic random access memory circuit to be set to a predetermined test mode by activating said WE signal and said CAS signal prior to said RAS signal.

10. The device according to claim 1, wherein said test mode control circuit further comprises means for receiving an address signal, and said test mode control circuit supplies said operation mode signal at said second logic level to said memory circuit when said source voltage is equal to or higher than said second predetermined voltage, said first clock signal has said prescribed first clock signal state, and said address signal has a prescribed address signal state.

11. The device according to claim 1, wherein said test mode control circuit further comprises means for receiving a second clock signal and said test mode control circuit supplies said operation mode signal at said first logic level to said memory circuit when said source voltage is equal to or lower than said third predetermined voltage and when one of said first clock signal has said prescribed first clock signal state and said second clock signal has a prescribed second clock signal state.

12. The device according to claim 1, wherein said test mode control circuit further comprises means for receiving a second clock signal, and said test mode control circuit supplies said operation mode signal at the second logic level to said memory circuit when said source voltage is equal to or higher than said first predetermined voltage and when said test mode control circuit receives a predetermined sequence of said first clock signal and said second clock signal.

13. The device according to claim 1, wherein said first predetermined voltage is about 3 volts, said second predetermined voltage is about 6 volts, said third predetermined voltage is about 4 volts.

14. A semiconductor memory device comprising:
a memory circuit operable in a normal operation mode in response to a first logic level of an operation mode signal and in a test mode in response to a second logic level of the operation mode signal, said memory circuit receiving a source voltage at a first predetermined voltage during said normal operation mode and receiving the source voltage at a second predetermined voltage during said test mode, said second predetermined voltage being greater than said first predetermined voltage;
a test mode control circuit for receiving said source voltage and a first clock signal, for supplying said operation mode signal at said second logic level to said memory circuit when said source voltage is equal to or higher than a third predetermined voltage and said first clock signal has a prescribed first clock signal state, wherein said third predetermined voltage is different from said first predetermined voltage.

15. The device according to claim 14, wherein said test mode control circuit comprises:
a source voltage comparing circuit for comparing said source voltage with said third predetermined voltage to detect that said source voltage is equal to or higher than said third predetermined voltage;
a circuit, responsive to said source voltage comparing circuit, for outputting said operation mode signal at said second logic level when said source voltage is equal to or higher than said third predetermined voltage and said first clock signal has said prescribed first clock signal state.

16. The device according to claim 15, wherein said source voltage comparing circuit comprises a differential amplifier circuit for comparing said source voltage with said third predetermined voltage to detect that said source voltage is equal to or higher than said third predetermined voltage.

17. The device according to claim 16, wherein said differential amplifier circuit has a current source that activates said differential amplifier circuit when said first clock signal has said prescribed first clock signal state.

18. The device according to claim 14, wherein said memory circuit operates in a voltage stress mode when said operation mode signal has said second logic level.

19. The device according to claim 14, wherein said memory circuit comprises a dynamic random access memory circuit, and said test mode control circuit includes means for inputting a write enable (WE) signal, a column address strobe (CAS) signal, and a row address strobe (RAS) signal, and means for controlling said dynamic random access memory circuit to be set to a predetermined test mode by activating said WE signal and said CAS signal prior to said RAS signal.

20. The device according to claim 14, wherein said test mode control circuit further comprises means for receiving an address signal, and said test mode control circuit supplies said operation mode signal at said second logic level to said memory circuit when said source voltage is equal to or higher than said third predetermined voltage, said first clock signal has said prescribed first clock signal state, and said address signal has a prescribed address signal state.

21. The device according to claim 14, wherein said test mode control circuit further comprises means for receiving a second clock signal, and said test mode control circuit supplies said operation mode signal at the second logic level to said memory circuit when said source voltage is equal to or higher than said third predetermined voltage and when said test mode control circuit receives a predetermined sequence of said first clock signal and said second clock signal.

22. The device according to claim 14, wherein said first predetermined voltage is about 3 volts, said second predetermined voltage is about 5 volts, and said third predetermined voltage is about 6 volts.

23. A semiconductor memory device comprising:
a memory circuit operable in a normal operation mode in response to a first logic level of an operation mode signal and in a voltage stress mode in response to a second logic level of the operation mode signal;
a test mode control circuit for receiving a power signal and a clock signal, for supplying said operation mode signal at said second logic level to said memory circuit when a voltage of said power signal is equal to or higher than a predetermined voltage and said clock signal has a prescribed state.

24. A semiconductor memory device comprising:
a memory circuit operable in a normal operation mode in response to a first logic level of an operation mode signal and in a test mode in response to a second logic level of the operation mode signal;
a test mode control circuit for receiving a power signal and a clock signal, for supplying said operation mode signal at said second logic level to said memory circuit when a voltage of said power signal is equal to or higher than a predetermined voltage and said clock signal has a prescribed state, wherein
said memory circuit comprises a dynamic random access memory circuit, and said test mode control circuit includes means for inputting a write enable (WE) signal, a column address strobe (CAS) signal, and a row address strobe (RAS) signal, and means for controlling said dynamic random access memory circuit to be set to a predetermined test mode by activating said WE signal and said CAS signal prior to said RAS signal.

* * * * *